US011955935B2

(12) United States Patent
Okuda

(10) Patent No.: US 11,955,935 B2
(45) Date of Patent: Apr. 9, 2024

(54) SIGNAL PROCESSING DEVICE AND ADJUSTING METHOD

(71) Applicant: PANASONIC INTELLECTUAL PROPERTY MANAGEMENT CO., LTD., Osaka (JP)

(72) Inventor: Tadayoshi Okuda, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 496 days.

(21) Appl. No.: 17/423,068

(22) PCT Filed: Jun. 16, 2020

(86) PCT No.: PCT/JP2020/023507
§ 371 (c)(1),
(2) Date: Jul. 14, 2021

(87) PCT Pub. No.: WO2021/039037
PCT Pub. Date: Mar. 4, 2021

(65) Prior Publication Data
US 2022/0103138 A1    Mar. 31, 2022

(30) Foreign Application Priority Data
Aug. 27, 2019    (JP) .................. 2019-154601

(51) Int. Cl.
*H03F 3/217*     (2006.01)
*H03F 1/32*      (2006.01)
*H04R 3/04*      (2006.01)

(52) U.S. Cl.
CPC .......... *H03F 3/217* (2013.01); *H03F 1/3241* (2013.01); *H04R 3/04* (2013.01)

(58) Field of Classification Search
CPC ...... H03F 3/217; H03F 1/3241; H03F 3/2175; H03F 2200/03; H03F 2200/331;
(Continued)

(56) References Cited

U.S. PATENT DOCUMENTS 6,941,118 B2 *   9/2005 Yamamoto ............... H03F 1/34
                                                    375/296
2006/0125555 A1  6/2006 Watts
(Continued)

FOREIGN PATENT DOCUMENTS

JP    3801118 B2     7/2006
JP    2007-110646 A  4/2007
(Continued)

OTHER PUBLICATIONS

International Search Report and Written Opinion dated Aug. 4, 2020 in International Patent Application No. PCT/JP2020/023507; with partial English translation.

*Primary Examiner* — Andrea Lindgren Baltzell
*Assistant Examiner* — Khiem D Nguyen
(74) *Attorney, Agent, or Firm* — Rimon P.C.

(57) ABSTRACT

The signal processing device includes: an offset adjuster; an amplitude adjuster; and a delay adjuster, wherein the offset adjuster adjusts the DC offset using a first parameter regarding the DC offset determined based on an output of the offset adjuster which is output when no signal is input to the signal processing circuit by the subtractor, the amplitude adjuster adjusts the amplitude using a second parameter regarding the amplitude determined based on (i) an output of the amplitude adjuster which is output when a first test signal is input to the signal processing circuit and (ii) the first test signal, and the delay adjuster adjusts the delay using a third parameter regarding the delay determined based on the
(Continued)

difference signal that is an output of the subtractor when a second test signal is input to the signal processing circuit.

6 Claims, 9 Drawing Sheets

(58) Field of Classification Search
CPC ......... H03F 2200/351; H03F 2200/391; H03F 1/3247; H03F 1/3264; H03F 3/187; H03F 1/304; H04R 3/04; H04R 3/007
USPC .......................................................... 330/10
See application file for complete search history.

(56) References Cited

U.S. PATENT DOCUMENTS

| | | | |
|---|---|---|---|
| 2010/0316226 | A1 | 12/2010 | Yoneda et al. |
| 2016/0323669 | A1 | 11/2016 | Iwata |
| 2019/0028069 | A1 | 1/2019 | Watanabe |

FOREIGN PATENT DOCUMENTS

| | | | |
|---|---|---|---|
| JP | 2010-288119 A | 12/2010 | |
| JP | 4708159 B2 | 6/2011 | |
| WO | 2015/125195 A1 | 8/2015 | |

\* cited by examiner

SIGNAL PROCESSING DEVICE AND ADJUSTING METHOD

CROSS-REFERENCE OF RELATED APPLICATIONS

This application is the U.S. National Phase under 35 U.S.C. § 371 of International Patent Application No. PCT/JP2020/023507, filed on Jun. 16, 2020, which in turn claims the benefit of Japanese Application No. 2019-154601, filed on Aug. 27, 2019, the entire disclosures of which Applications are incorporated by reference herein.

TECHNICAL FIELD

The present disclosure relates to a signal processing device that amplifies a digital audio signal and a method for adjusting parameters of the signal processing device.

BACKGROUND ART

In recent years, an amplifier (also referred to as a full digital amplifier), which does not convert a digital audio signal into an analog signal, but directly generates a switching signal by digital modulation and amplifies the digital signal as is, has been developed. However, in a full digital amplifier, since the driver circuit switches directly to the power supply circuit, the waveform of the power supply noise appears at the amplifier output due to the mixing of the power supply noise. In addition, when a large current flows due to the wire resistance of the wiring from the power supply circuit and the like, the voltage drops and harmonic distortion occurs. Furthermore, as the switching transistor, a metal oxide semiconductor field effect transistor (MOSFET) or the like capable of high-speed response is used. However, since switching is performed at several hundred kHz or higher, waveform fluctuations such as rise delay, overshoot, or ringing occur at the rising portion of the switching waveform due to the parasitic capacitance of the MOSFET and the inductance component on the board pattern, and harmonic distortion and noise increase.

Therefore, a technology to reduce the distortion component by extracting the input/output difference, that is, the components such as distortion and noise (hereinafter, also referred to as the distortion component) using the feedback technology and returning them to the input in the opposite phase has been developed (for example, Patent Literature (PTL) 1 and 2).

CITATION LIST

Patent Literature

[PTL 1] Japanese Patent No. 3801118
[PTL 2] Japanese Patent No. 4708159

SUMMARY OF INVENTION

Technical Problem

In order to accurately extract the input/output difference using the feedback technology, it is necessary to subtract the signal that is to be fed back and the input signal on the same scale, that is, the amplitude, DC offset and the like of the signal that is to be fed back need to be adjusted. For example, as a method of making the adjustment, a method of using a variable resistor can be considered. However, when a variable resistor is used, the resistance value shifts due to aged deterioration of the variable resistor, and the resistance value also shifts due to an impact such as vibration. Furthermore, when the variable resistor is manually adjusted, the adjustment varies depending on the person making the adjustment. In this way, in the method using a variable resistor, it is difficult to accurately adjust the amplitude and DC offset of the signal that is to be fed back, that is, it is difficult to accurately extract the distortion component.

Therefore, the present disclosure provides a signal processing device or the like capable of more accurately extracting distortion components using feedback technology.

Solution to Problem

The signal processing device in the present disclosure includes a subtractor that subtracts a feedback signal from an input signal that is a digital audio signal and outputs a first digital signal; a signal processing circuit that performs signal processing on the first digital signal and outputs a second digital signal; a power amplifier circuit that amplifies the second digital signal, converts the second digital signal amplified into an analog signal, and outputs the analog signal; an A/D converter that converts the analog signal into a third digital signal and outputs the third digital signal; an offset adjuster that adjusts a DC offset for the third digital signal; an amplitude adjuster that adjusts an amplitude for the third digital signal; a delay adjuster that adjusts a delay of the second digital signal; and a calculator that extracts a difference signal which is a difference between the third digital signal having the DC offset adjusted by the offset adjuster and the amplitude adjusted by the amplitude adjuster and the second digital signal having the delay adjusted by the delay adjuster, and outputs the feedback signal based on the difference signal, wherein the offset adjuster adjusts the DC offset using a first parameter regarding the DC offset determined based on an output of the offset adjuster which is output when no signal is input to the signal processing circuit by the subtractor, the amplitude adjuster adjusts the amplitude using a second parameter regarding the amplitude determined based on (i) an output of the amplitude adjuster which is output when the input signal and the feedback signal are not input to the subtractor and a first test signal is input to the signal processing circuit and (ii) the first test signal, and the delay adjuster adjusts the delay using a third parameter regarding the delay determined based on the difference signal when the input signal and the feedback signal are not input to the subtractor and a second test signal is input to the signal processing circuit.

The adjusting method in the present disclosure is a method for adjusting parameters for a signal processing device which includes: a subtractor that subtracts a feedback signal from an input signal that is a digital audio signal and outputs a first digital signal; a signal processing circuit that performs signal processing on the first digital signal and outputs a second digital signal; a power amplifier circuit that amplifies the second digital signal, converts the second digital signal amplified into an analog signal, and outputs the analog signal; an A/D converter that converts the analog signal into a third digital signal and outputs the third digital signal; an offset adjuster that adjusts a DC offset for the third digital signal; an amplitude adjuster that adjusts an amplitude for the third digital signal; a delay adjuster that adjusts a delay of the second digital signal; and a calculator that extracts a difference signal which is a difference between the third digital signal having the DC offset adjusted by the offset adjuster and the amplitude adjusted by the amplitude adjuster and the second digital signal having the delay adjusted by the delay adjuster, and outputs the feedback signal based on the difference signal, the method including: determining a first parameter regarding the DC offset determined based on an output of the offset adjuster which is output when no signal is input to the signal processing circuit by the subtractor; determining a second parameter regarding the amplitude based on (i) an output of the amplitude adjuster which is output when the input signal and the feedback signal are not input to the subtractor and a first test signal is input to the signal processing circuit and (ii) the first test signal; and determining a third parameter regarding the delay based on the difference signal when the input signal and the feedback signal are not input to the subtractor and a second test signal is input to the signal processing circuit.

Advantageous Effects of Invention

According to the signal processing device and the like in the present disclosure, the distortion component can be extracted more accurately by using the feedback technology.

DESCRIPTION OF EMBODIMENTS

Hereinafter, an embodiment will be described in detail with reference to the drawings as appropriate. However, more detailed description than necessary may be omitted. For example, detailed description of already well-known matters and duplicate description for substantially the same configuration may be omitted. This is to avoid unnecessary redundancy of the following description and to facilitate the understanding of those skilled in the art.

It should be noted that the inventor provides the accompanying drawings and the following description in order for those skilled in the art to fully understand the present disclosure, and these are not intended to limit the subject matter described in the claims.

Embodiment

Hereinafter, an embodiment will be described with reference to FIG. 1 to FIG. 8B.

[Configuration]

Figure 1:
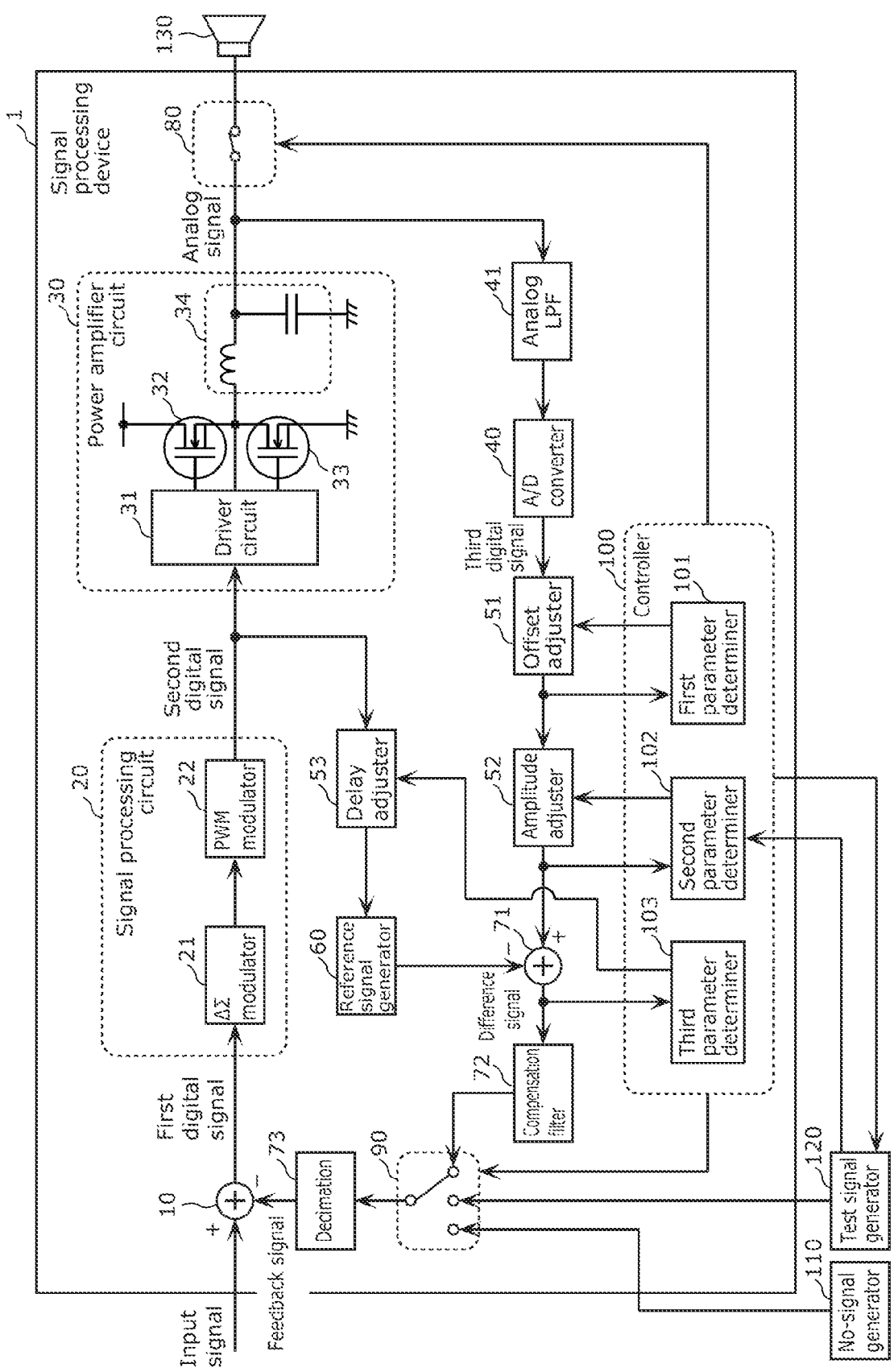
FIG. 1 is a configuration diagram showing an example of a signal processing device according to an embodiment.

FIG. 1 is a configuration diagram showing an example of signal processing device 1 according to the embodiment. In addition to signal processing device 1, FIG. 1 shows no-signal generator 110, test signal generator 120, and speaker 130. No-signal generator 110, test signal generator 120, and speaker 130 may be provided in signal processing device 1.

Signal processing device 1 is a device that inputs a digital audio signal obtained from a music source, processes the digital audio signal, and outputs an analog signal to speaker 130 in order to reproduce the music source stored in a storage medium such as a compact disc (CD), a digital versatile disc (DVD), a Blu-ray (registered trademark) disc (BD), a hard disc drive (HDD) or the like.

In addition, signal processing device 1 has a function of feeding back the signal output to speaker 130 to reduce the distortion component generated in power amplifier circuit 30 or the like described later. It should be noted that in signal processing device 1, the parameters of the circuit configuration related to the feedback can be adjusted without using the variable resistor by the processing by controller 100 or the like described later.

Signal processing device 1 includes subtractor 10, signal processing circuit 20, power amplifier circuit 30, A/D converter 40, analog LPF 41, offset adjuster 51, amplitude adjuster 52, delay adjuster 53, and reference signal generator 60, subtractor 71, compensation filter 72, decimation filter 73, switch 80, selector 90 and controller 100.

Subtractor 10 is a circuit that subtracts a feedback signal from an input signal that is a digital audio signal and outputs a first digital signal. The feedback signal is a signal generated by feeding back an analog signal output from power amplifier circuit 30 and performing various signal processing. For example, the feedback signal is a signal that is obtained by processing an analog signal by analog LPF 41, A/D converter 40, offset adjuster 51, amplitude adjuster 52, subtractor 71, compensation filter 72 and decimation filter 73, and is output from decimation filter 73. The feedback signal includes a distortion component generated by power amplifier circuit 30 or the like, and the distortion component generated by power amplifier circuit 30 or the like can be canceled by subtracting the distortion component in advance in subtractor 10.

Signal processing circuit 20 is a circuit that performs signal processing on the first digital signal and outputs the second digital signal. Signal processing circuit 20 includes ΔΣ modulator 21 and pulse width modulation (PWM) modulator 22.

ΔΣ modulator 21 requantizes the number of gradations of the pulse width of PWM modulator 22 which is smaller than the input audio signal. Due to the feature of the noise shaping of the ΔΣ-modulation that pushes the re-quantization noise out of the audible band of, for example, 20 kHz or more, the re-quantization noise generated at the time of re-quantization is reduced in the audible band.

PWM modulator 22 converts a signal output by ΔΣ modulator 21 to a second digital signal (pulse width modulated signal) having the gradation of the pulse width represented by two values of 1 and 0 or 1 and −1 for the gradation of the amplitude level of the signal.

The second digital signal contains a distortion component when it is amplified by power amplifier circuit 30 and converted into an analog signal. In order to reduce this distortion component, the difference between the signals before and after the distortion component is superimposed is extracted. As shown in FIG. 1, the second digital signal before the distortion component is superimposed is input to subtractor 71.

Power amplifier circuit 30 is a circuit that amplifies the signal amplitude of the second digital signal, converts the amplified second digital signal into an analog signal, and outputs the analog signal. Power amplifier circuit 30 includes driver circuit 31, switching transistors 32 and 33, and low pass filter (LPF) 34. It should be noted that power amplifier circuit 30 is a circuit that also includes a D/A conversion function because it converts a digital signal into an analog signal and outputs the analog signal.

Driver circuit 31 and switching transistors 32 and 33 are circuits that amplify the second digital signal. Switching transistors 32 and 33 are included in a push-pull circuit. Switching transistors 32 and 33 are, for example, n-type MOSFETs, respectively. It should be noted that switching transistors 32 and 33 may be a combination of an n-type MOSFET and a p-type MOSFET.

LPF 34 is a filter that demodulates the amplified signal into an analog signal (analog audio signal), and it filters the components higher than a predetermined cutoff frequency such as re-quantization noise of the $\Delta\Sigma$ modulator and a carrier signal superimposed by PWM modulation out of the amplified signal and outputs the filtered signal. LPF 34 includes an inductor and a capacitor in order to reduce power loss.

In power amplifier circuit 30, when the signal is amplified, power supply noise, distortion due to wiring resistance, distortion due to fluctuation of the switching waveform, and the like occur, so that the analog signal output from power amplifier circuit 30 includes a distortion component. In order to reduce such a distortion component, the analog signal output from power amplifier circuit 30 is fed back. The analog signal on which the distortion component to be fed back is superimposed is converted into a third digital signal by A/D converter 40 described later, and the difference (that is, the distortion component) between the third digital signal and the second digital signal before the distortion component is superimposed is extracted by subtractor 71.

Analog LPF 41 is a filter for performing antialiasing processing at the time of A/D conversion. Analog LPF 41 removes aliasing noise, which is a frequency component exceeding half of the sampling frequency of A/D converter 40, in advance.

A/D converter 40 is a circuit that converts an analog signal into a third digital signal and outputs the third digital signal. In order to extract the difference (that is, the distortion component) between the second digital signal and the analog signal output from power amplifier circuit 30, A/D converter 40 converts the analog signal into a digital signal having the same signal format as the second digital signal.

Offset adjuster 51 is a circuit that adjusts the DC offset for the third digital signal. Specifically, offset adjuster 51 adjusts the DC offset using a first parameter regarding the DC offset determined based on the output of offset adjuster 51 which is output when no signal is input to signal processing circuit 20 by subtractor 10. The first parameter will be described later. Since A/D converter 40 causes a DC offset error at the time of A/D conversion, a digital signal deviated by the DC offset from the input analog signal is output. When a digital signal having an error with respect to the input analog signal is output, the distortion component is extracted based on the digital signal having the error, so that it becomes difficult to accurately extract the distortion component. For this reason, offset adjuster 51 adjusts the DC offset for the third digital signal.

Amplitude adjuster 52 is a circuit that adjusts the amplitude for the third digital signal. Specifically, amplitude adjuster 52 adjusts the amplitude using a second parameter regarding the amplitude determined based on (i) an output of amplitude adjuster 52 which is output when the input signal and the feedback signal are not input to subtractor 10 and a first test signal is input to signal processing circuit 20 and (ii) the first test signal. The second parameter will be described later. In power amplifier circuit 30, the second digital signal is amplified, the amplified second digital signal is converted into an analog signal, and the analog signal is converted into a third digital signal by A/D converter 40. That is, the scale of the third digital signal is different from that of the second digital signal by the amount amplified by power amplifier circuit 30, and it is necessary to match the scale at the time of extracting the difference. For this reason, amplitude adjuster 52 adjusts the amplitude for the third digital signal. It should be noted that amplitude adjuster 52 adjusts the amplitude for the third digital signal having DC offset adjusted by offset adjuster 51.

Delay adjuster 53 is a circuit that adjusts the delay of the second digital signal. Specifically, delay adjuster 53 adjusts the delay using a third parameter regarding the delay determined based on a difference signal when the input signal and the feedback signal are not input to subtractor 10 and the second test signal is input to signal processing circuit 20. The third parameter and the difference signal will be described later. In A/D converter 40, a delay occurs at the time of A/D conversion, so that a phase shift between the second digital signal and the third digital signal occurs. For this reason, delay adjuster 53 delays the second digital in order to reduce the phase shift and perform the subtraction of the second digital signal and the third digital signal at the same timing.

It should be noted that signal processing device 1 includes offset adjuster 51, amplitude adjuster 52, and delay adjuster 53, but these components may not necessarily be used. That is, depending on the situation, the DC offset may not be adjusted, the amplitude may not be adjusted, or the delay may not be adjusted.

Reference signal generator 60 is a circuit that converts the second digital signal into a signal that matches the sampling frequency and the number of bits of the third digital signal, and includes an LPF and a decimation circuit. The second digital signal output from signal processing circuit 20 is, for example, a 1-bit, 110.592 MHz signal. On the other hand, the third digital signal output from A/D converter 40 is, for example, a 32-bit, 12.288 MHz signal. Reference signal generator 60 converts the second digital signal into a reference signal having the same multi-bit configuration and the same frequency as the third digital signal by filtering the re-quantization noise of the $\Delta\Sigma$ modulator and the carrier signal superimposed by the PWM modulation, and converting to the same frequency as the third digital signal by the decimation circuit. This makes it possible to subtract the second digital signal (reference signal) and the third digital signal.

Subtractor 71, compensation filter 72 and decimation filter 73 are components of a calculator that extracts a difference signal which is a difference between the third digital signal having the DC offset adjusted by the offset adjuster and the amplitude adjusted by the amplitude adjuster and the second digital signal having the delay adjusted by the delay adjuster, and outputs the feedback signal based on the difference signal.

Subtractor 71 is a circuit that subtracts the second digital signal (reference signal) having the delay adjusted by delay adjuster 53 from the third digital signal having the DC offset adjusted by offset adjuster 51 and the amplitude adjusted by amplitude adjuster 52, and outputs a difference signal, which is the difference therebetween.

Compensation filter 72 is a filter that extracts and outputs a frequency component corresponding to a distortion component included in the difference signal. Compensation filter 72 is connected to, for example, the selection terminal of selector 90.

Decimation filter 73 is a filter that downsamples the signal output from compensation filter 72. Since the input signal is, for example, 1.536 MHz and the third digital signal is, for example, 12.288 MHz as described above, decimation filter 73 converts into a feedback signal having the same frequency of 1.536 MHz as the input signal by downsampling the output of compensation filter 72 of 12.288 MHz, and outputs the feedback signal to subtractor 10.

Switch 80 is a switch provided between power amplifier circuit 30 and speaker 130 that converts an analog signal output from power amplifier circuit 30 to sound. Switch 80 is, for example, a relay or a semiconductor switch. By putting switch 80 into the non-conductive state, it is possible to prevent the sound from being output from speaker 130.

Selector 90 is a switch for switching a signal output to subtractor 10 (in other words, a signal input from subtractor 10 to signal processing circuit 20). Selector 90 is, for example, a semiconductor switch. Selector 90 includes a common terminal connected to decimation filter 73, a selection terminal connected to compensation filter 72, a selection terminal connected to no-signal generator 110, and a selection terminal connected to test signal generator 120. Selector 90 switches the connection between subtractor 10 (decimation filter 73) and any of compensation filter 72, no-signal generator 110, and test signal generator 120.

Controller 100 is a processing unit for determining parameters (a first parameter, a second parameter, and a third parameter) of a circuit related to feedback in signal processing device 1. Controller 100 includes first parameter determiner 101, second parameter determiner 102, and third parameter determiner 103 as functional components. Controller 100 includes, for example, a processor (microcomputer or the like), a memory, and the like, and first parameter determiner 101, second parameter determiner 102, and third parameter determiner 103 are realized by the processor executing a program stored in the memory.

First parameter determiner 101 determines the first parameter regarding the DC offset. Specifically, first parameter determiner 101 determines the offset amount in offset adjuster 51 as the first parameter.

Second parameter determiner 102 determines the second parameter regarding the amplitude. Specifically, second parameter determiner 102 determines the gain of amplitude adjuster 52 as the second parameter.

Third parameter determiner 103 determines the third parameter regarding the delay. Specifically, third parameter determiner 103 determines the delay amount in delay adjuster 53 as the third parameter.

In addition, controller 100 controls the conductive state and the non-conductive state of switch 80.

In addition, controller 100 controls the connection state of selector 90.

No-signal generator 110 is a circuit that generates a digital signal (referred to as no-signal) indicating 0. No-signal generator 110 is connected to the selection terminal of selector 90. It should be noted that as long as a no-signal can be input to signal processing circuit 20 in response to an instruction from controller 100, the connection form of no-signal generator 110 is not limited thereto.

Test signal generator 120 is a circuit that generates a test signal such as a sine wave of an arbitrary frequency or the like. Test signal generator 120 generates, for example, a first test signal and a second test signal having different frequencies from each other in response to an instruction from controller 100. Test signal generator 120 is connected to the selection terminal of selector 90. It should be noted that if the test signal can be input to signal processing circuit 20 in response to the instruction from controller 100, the connection form of test signal generator 120 is not limited thereto.

Speaker 130 converts the power of the analog signal output from power amplifier circuit 30 to sound energy.

[Operation]

Next, the operation at the time of determining the parameters (first parameter, second parameter, and third parameter) of signal processing device 1 will be described with reference to FIG. 2 to FIG. 8B.

Figure 2:
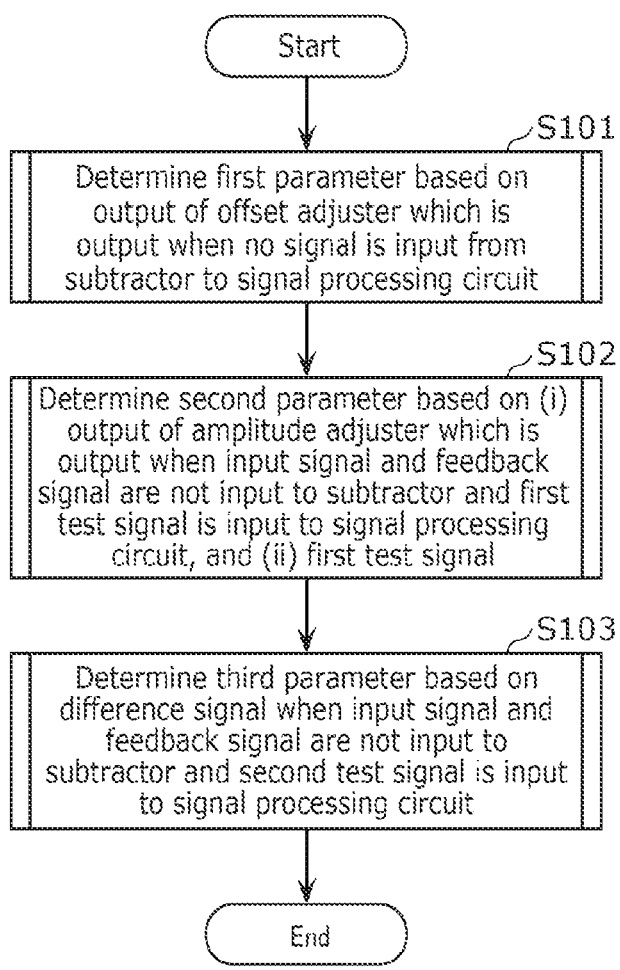
FIG. 2 is a flowchart showing an example of an operation at the time of determining parameters of the signal processing device according to the embodiment.

FIG. 2 is a flowchart showing an example of an operation at the time of determining the parameters of signal processing device 1 according to the embodiment.

Controller 100 determines the first parameter regarding the DC offset based on the output of offset adjuster 51 which is output when no signal is input to signal processing circuit 20 by subtractor 10 (step S101). Details of step S101 will be described with reference to FIG. 3 and FIG. 4 described later.

Controller 100 determines the second parameter regarding the amplitude based on (i) an output of amplitude adjuster 52 which is output when the input signal and the feedback signal are not input to subtractor 10 and a first test signal is input to signal processing circuit 20 and (ii) the first test signal (step S102). Details of step S102 will be described with reference to FIG. 5 and FIG. 6 described later.

Controller 100 determines a third parameter regarding the delay determined based on the difference signal in a calculator (subtractor 71) when the input signal and the feedback signal are not input to subtractor 10 and a second test signal is input to signal processing circuit 20 (step S103). Details of step S103 will be described with reference to FIG. 7, FIG. 8A and FIG. 8B described later.

As shown in FIG. 2, controller 100 determines each parameter in order of, for example, the first parameter, the second parameter, and the third parameter.

For example, controller 100 performs a process for determining each parameter when the power of the voice reproduction device equipped with signal processing device 1 is turned on. In addition, for example, controller 100 may perform the process for determining each parameter at a specific timing even after the power is turned on. This is because the circuits included in the audio reproduction device often have temperature characteristics, and the temperature rises after the power is turned on, so some cases are that the signal that is to be fed back cannot be adjusted correctly with the parameters determined when the power is turned on. For example, the process of determining each parameter may be performed at a timing such as when the CD or DVD is switched after the power is turned on.

[Operation at the Time of Determining the First Parameter]

The operation at the time of determining the first parameter regarding the DC offset will be described with reference to FIG. 3 and FIG. 4.

Figure 3:
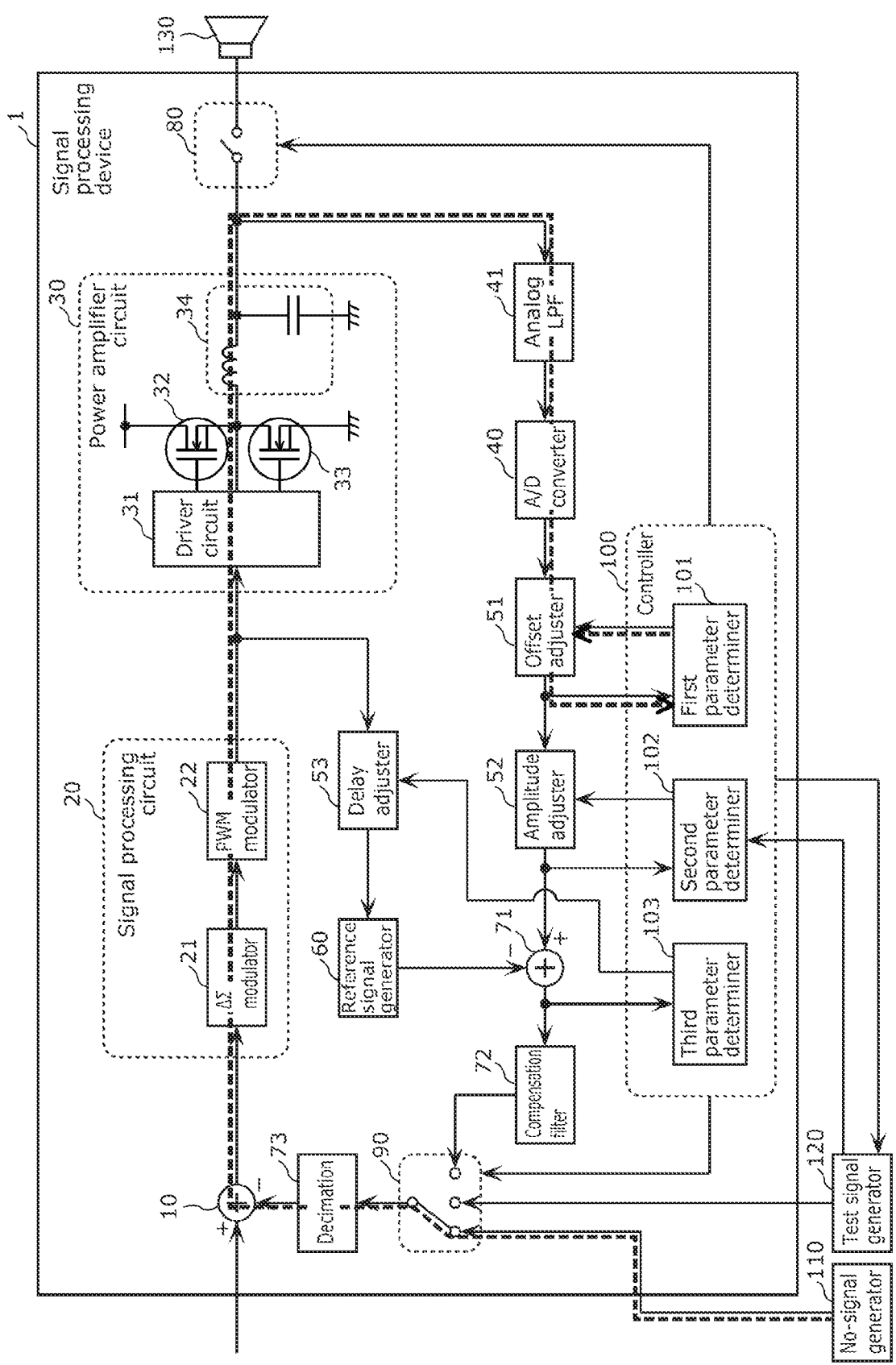
FIG. 3 is a diagram for illustrating a signal flow at the time of determining the first parameter of the signal processing device according to the embodiment.

FIG. 3 is a diagram for illustrating a signal flow at the time of determining the first parameter of signal processing device 1 according to the embodiment. In FIG. 3, the signal flow is indicated by a thick dashed arrow.

Figure 4:
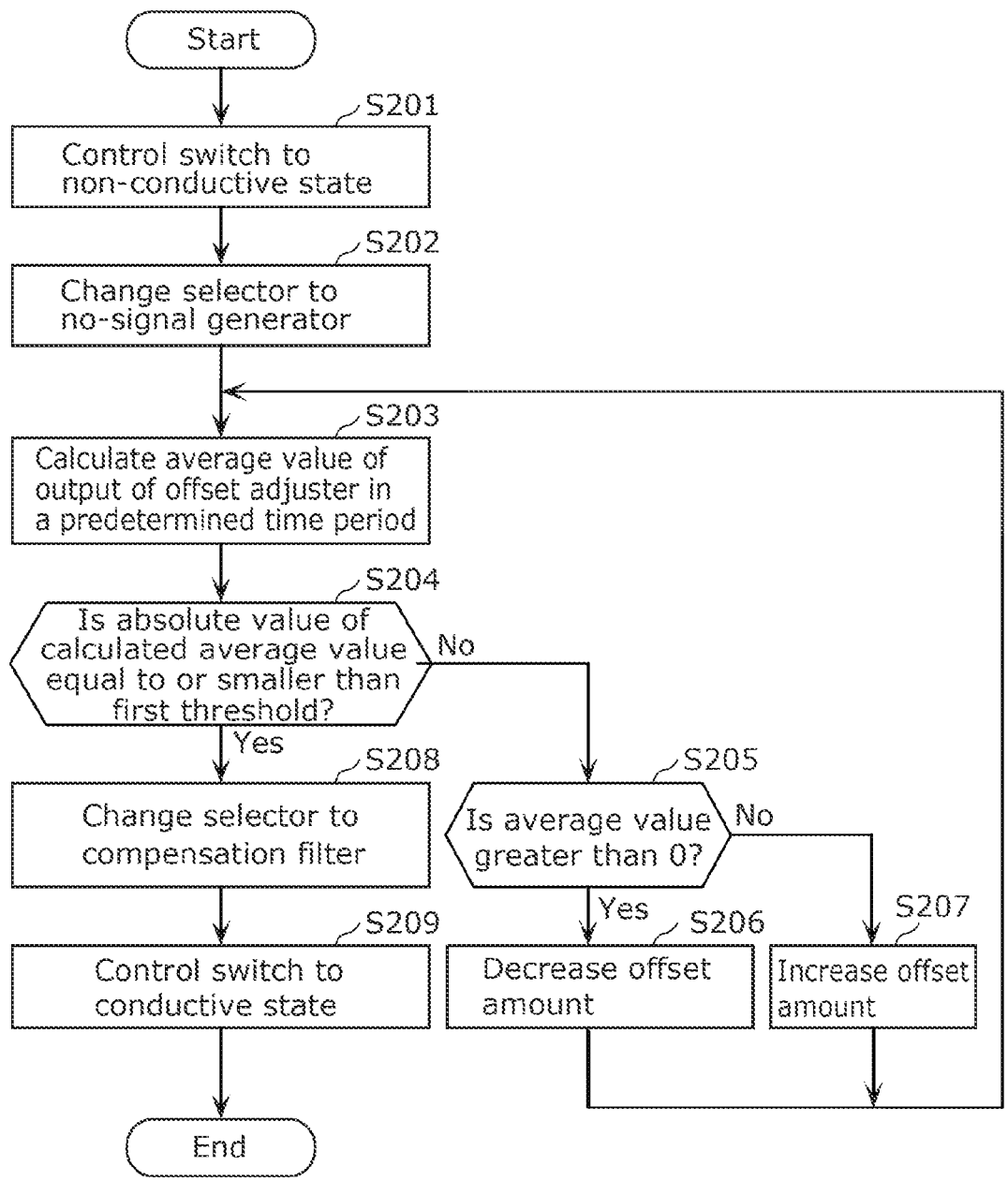
FIG. 4 is a flowchart showing an example of an operation at the time of determining the first parameter of the signal processing device according to the embodiment.

FIG. 4 is a flowchart showing an example of the operation at the time of determining the first parameter of signal processing device 1 according to the embodiment. FIG. 4 is a flowchart showing the details of step S101 of FIG. 2.

Controller 100 controls switch 80 so that it is in a non-conductive state (step S201). By making switch 80 in a non-conductive state, it is possible to prevent sound from being output from speaker 130 when determining the first parameter. It should be noted that since no signal is input to signal processing circuit 20 (in other words, a no-signal is input) at the time of determining the first parameter, switch 80 may remain in the conductive state.

Controller 100 changes the connection destination of selector 90 to no-signal generator 110 (step S202). In addition, it is assumed that the input signal is not input to subtractor 10 at the time of determining the first parameter. As shown in FIG. 3, this creates a state in which no signal is input to signal processing circuit 20 by subtractor 10 (a state that a no-signal is input to signal processing circuit 20). As shown in FIG. 3, controller 100 (first parameter determiner 101) determines the first parameter based on the output of offset adjuster 51 which is output when no signal is input to signal processing circuit 20 by subtractor 10.

Specifically, controller 100 first calculates the average value of the output of offset adjuster 51 at a predetermined time (the predetermined time is not particularly limited) (step S203). When no signal is input to signal processing circuit 20, the output of A/D converter 40 is ideally 0, but in fact, the output corresponds to the DC offset error of A/D converter 40. By preventing the signal from being input to signal processing circuit 20, the DC offset error of A/D converter 40 can be confirmed as the output of A/D converter 40. The first parameter is, for example, the offset amount of offset adjuster 51. In the initial state, the offset amount is, for example, 0, so the output of A/D converter 40 at this time becomes the output of offset adjuster 51 almost as it is. Since the output of A/D converter 40 may fluctuate depending on the time, the average value of the output of offset adjuster 51 in a predetermined time period is calculated.

Next, controller 100 determines whether the absolute value of the calculated average value is equal to or smaller than the first threshold (for example, A (positive number)) (step S204). That is, controller 100 determines whether the average value of the output of offset adjuster 51 is equal to or greater than −A and equal to or smaller than +A.

When the absolute value of the calculated average value is not equal to or smaller than A (No in step S204), controller 100 determines whether the average value is greater than 0 (step S205).

When the calculated average value is greater than 0 (Yes in step S205), controller 100 decreases the offset amount (step S206). That is, since the output of offset adjuster 51 has a value greater than A due to the DC offset error of A/D converter 40, the offset amount in offset adjuster 51 is adjusted so that the output of offset adjuster 51 approaches 0 by decreasing the offset amount of offset adjuster 51.

When the calculated average value is smaller than 0 (No in step S205), controller 100 increases the offset amount (first parameter) (step S207). That is, since the output of offset adjuster 51 is smaller than −A due to the DC offset error of A/D converter 40, the offset amount in offset adjuster 51 is adjusted so that the output of offset adjuster 51 approaches 0 by increasing the offset amount of offset adjuster 51.

Then, the processes from step S203 are performed again. That is, it is repeated until the absolute value of the average value of the output of offset adjuster 51 becomes equal to or smaller than A that after adjusting the offset amount in offset adjuster 51, the output of offset adjuster 51 which is output when no signal is input to signal processing circuit 20 is confirmed, and according to the output, the offset amount in offset adjuster 51 is adjusted again.

When the absolute value of the calculated average value is equal to or smaller than A (Yes in step S204), controller 100 determines the current offset amount in offset adjuster 51 as the first parameter.

Then, controller 100 changes the connection destination of selector 90 to compensation filter 72 (step S208), and controls switch 80 so that it is in a conductive state (step S209). With this, offset adjuster 51 adjusts the DC offset for the third digital signal using the first parameter (offset amount) regarding the DC offset determined based on the output of offset adjuster 51 which is output when no signal is input to signal processing circuit 20 by subtractor 10.

[Operation at the Time of Determining the Second Parameter]

The operation at the time of determining the second parameter regarding the amplitude will be described with reference to FIG. 5 and FIG. 6.

Figure 5:
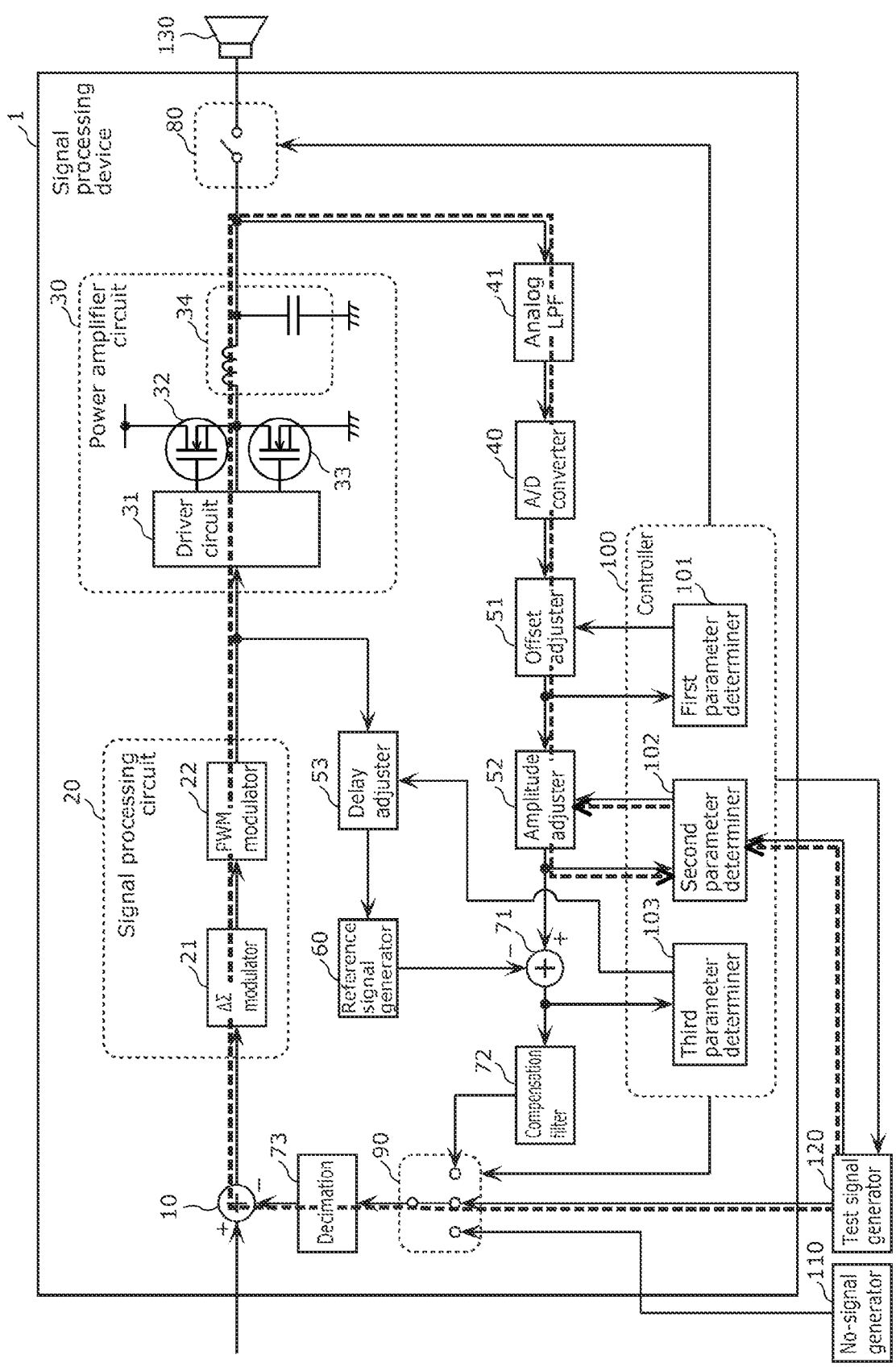
FIG. 5 is a diagram for illustrating a signal flow at the time of determining the second parameter of the signal processing device according to the embodiment.

FIG. 5 is a diagram for illustrating a signal flow at the time of determining the second parameter of signal processing device 1 according to the embodiment. In FIG. 5, the signal flow is indicated by a thick dashed arrow.

Figure 6:
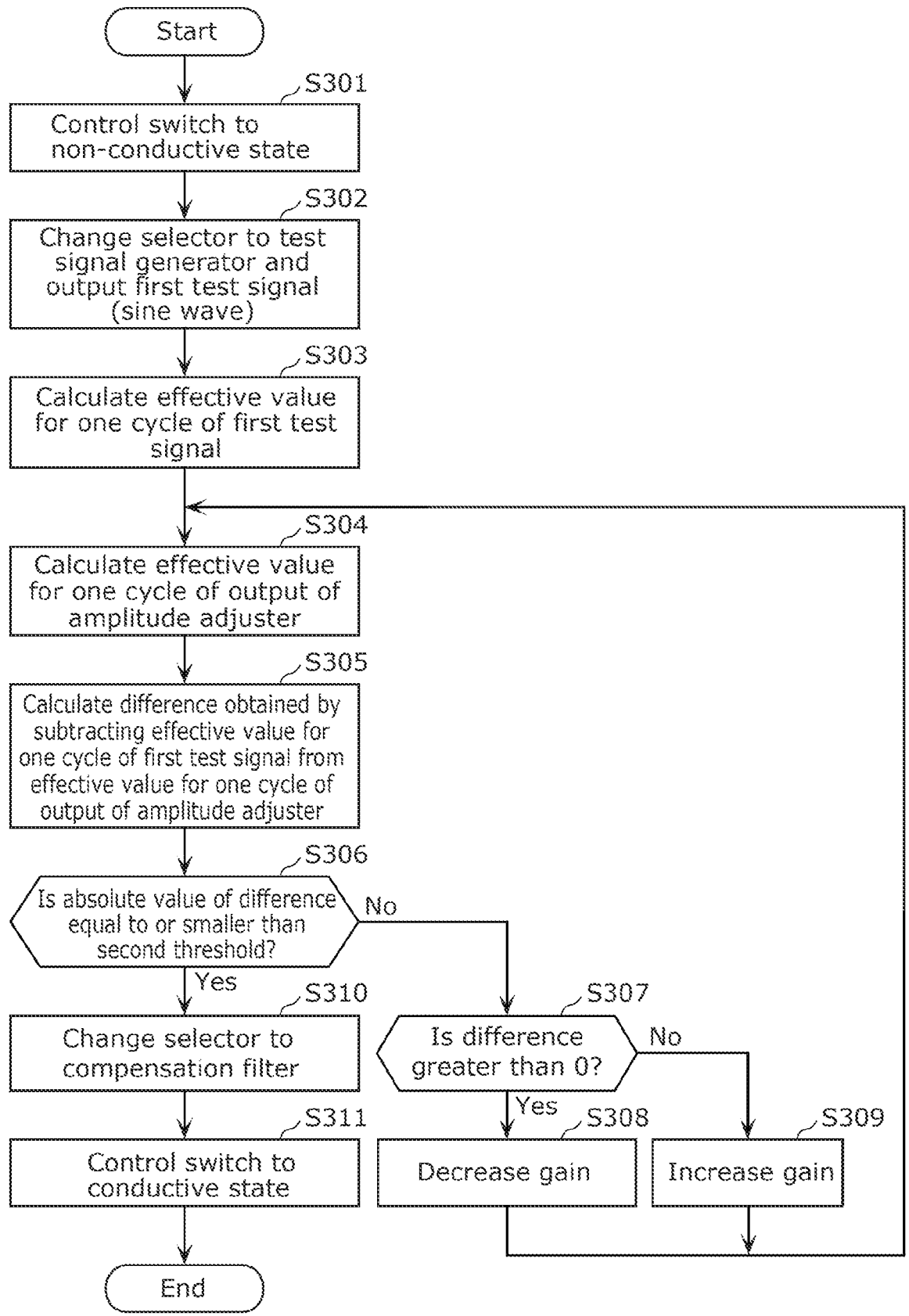
FIG. 6 is a flowchart showing an example of an operation at the time of determining the second parameter of the signal processing device according to the embodiment.

FIG. 6 is a flowchart showing an example of the operation at the time of determining the second parameter of signal processing device 1 according to the embodiment. FIG. 6 is a flowchart showing the details of step S102 of FIG. 2.

Controller 100 controls switch 80 so that it is in a non-conductive state (step S301). By making switch 80 in a non-conductive state, it is possible to prevent sound from being output from speaker 130 at the time of determining the second parameter. Since the first test signal is input to signal processing circuit 20 at the time of determining the second parameter, switch 80 is put into a non-conductive state so that the sound corresponding to the first test signal is not output from speaker 130.

Controller 100 changes the connection destination of selector 90 to test signal generator 120, and causes test signal generator 120 to output a first test signal (for example, a sine wave) having a predetermined frequency (step S302). In addition, it is assumed that no input signal is input to subtractor 10 at the time of determining the second parameter. With this, as shown in FIG. 5, it becomes in such a state that the input signal and the feedback signal are not input to subtractor 10, and the first test signal is input to signal processing circuit 20. As shown in FIG. 5, controller 100 (second parameter determiner 102) determines the second parameter regarding the amplitude based on (i) an output of amplitude adjuster 52 which is output when the input signal and the feedback signal are not input to subtractor 10 and a first test signal is input to signal processing circuit 20 and (ii) the first test signal (the first test signal before it is signal-processed by signal processing device 1).

Specifically, controller 100 calculates the effective value for one cycle of the first test signal obtained directly from test signal generator 120 by controller 100 (step S303). It should be noted that if the effective value for one cycle of the first test signal is a fixed value and is stored in a memory or the like, the process of calculating the effective value is unnecessary.

Controller 100 calculates the effective value for one cycle of the output of amplitude adjuster 52 (step S304). Since the first test signal input to signal processing circuit 20 is amplified by power amplification circuit 30, it is necessary to adjust the scale in order to subtract the signals before and after the amplification in subtractor 71. The effective value for one cycle of the first test signal obtained directly from test signal generator 120 by controller 100 corresponds to the amplitude of the signal before the amplification in power amplifier circuit 30, and the effective value for one cycle of the output of amplitude adjuster 52 corresponds to the amplitude of the signal after the amplification in power amplifier circuit 30.

Next, controller 100 calculates the difference obtained by subtracting the effective value for one cycle of the first test signal from the effective value for one cycle of the output of amplitude adjuster 52 (step S305). The larger the difference between the amplitude of the output of amplitude adjuster 52 and the amplitude of the first test signal, the larger the absolute value of the difference.

Controller 100 determines whether the absolute value of the calculated difference is equal to or smaller than the second threshold (for example, B (positive value)) (step S306). That is, controller 100 determines whether the difference is equal to or greater than −B and equal to or smaller than +B.

When the absolute value of the calculated difference is not equal to or smaller than B (No in step S306), controller 100 determines whether the difference is greater than 0 (step S307).

When the calculated difference is greater than 0 (Yes in step S307), controller 100 decreases the gain of amplitude adjuster 52 (step S308). That is, since the amplitude of the output of amplitude adjuster 52 is greater than the amplitude of the first test signal due to the amplification by power amplifier circuit 30, the gain of amplitude adjuster 52 is decreased and the difference is adjusted to approach 0.

When the calculated difference is smaller than 0 (No in step S307), controller 100 increases the gain of amplitude adjuster 52 (step S309). Although the details will be described later, when the gain of amplitude adjuster 52 is made too small in step S308 and the amplitude of the output of amplitude adjuster 52 becomes smaller than the amplitude of the first test signal, the gain of amplitude adjuster 52 is increased and the difference is adjusted to approach 0.

Then, the processes from step S304 are performed again. That is, it is repeated until the absolute value of the difference obtained by subtracting the effective value for one cycle of the first test signal from the effective value for one cycle of the output of amplitude adjuster 52 becomes equal to or smaller than B that after adjusting the gain of amplitude adjuster 52, the output of amplitude adjuster 52 which is output when the first signal is input to signal processing circuit 20 is confirmed, and according to the output, the gain of amplitude adjuster 52 is adjusted again.

When the absolute value of the calculated difference is equal to or smaller than B (Yes in step S306), controller 100 determines the current gain of amplitude adjuster 52 as the second parameter.

Then, controller 100 changes the connection destination of selector 90 to compensation filter 72 (step S310), and controls switch 80 so that it is in a conductive state (step S311). With this, amplitude adjuster 52 adjusts the amplitude for the third digital signal using a second parameter regarding the amplitude determined based on (i) an output of amplitude adjuster 52 which is output when the input signal and the feedback signal are not input to subtractor 10 and a first test signal is input to signal processing circuit 20 and (ii) the first test signal.

It should be noted that an example of adjusting the second parameter by calculating the effective value for one cycle of the test signal has been described, but in order to simplify the calculation on the circuit, the second parameter may be adjusted using the maximum value of the amplitude for one cycle of the test signal.

[Operation at the Time of Determining the Third Parameter]

The operation at the time of determining the third parameter regarding the delay will be described with reference to FIG. 7, FIG. 8A and FIG. 8B.

Figure 7:
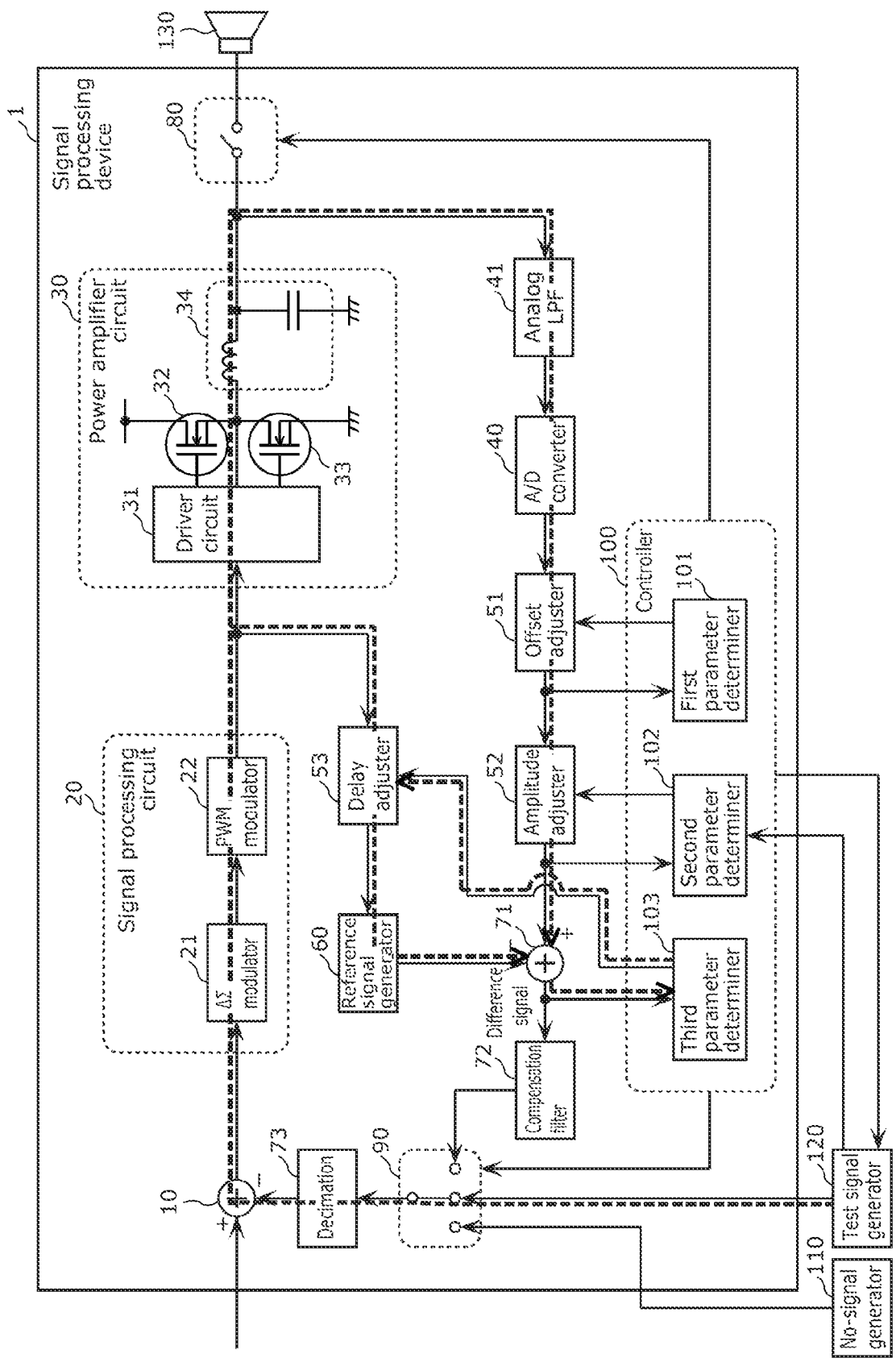
FIG. 7 is a diagram for illustrating a signal flow at the time of determining the third parameter of the signal processing device according to the embodiment.

FIG. 7 is a diagram for illustrating a signal flow at the time of determining the third parameter of signal processing device 1 according to the embodiment. In FIG. 7, the signal flow is indicated by a thick dashed arrow.

Figure 8A:
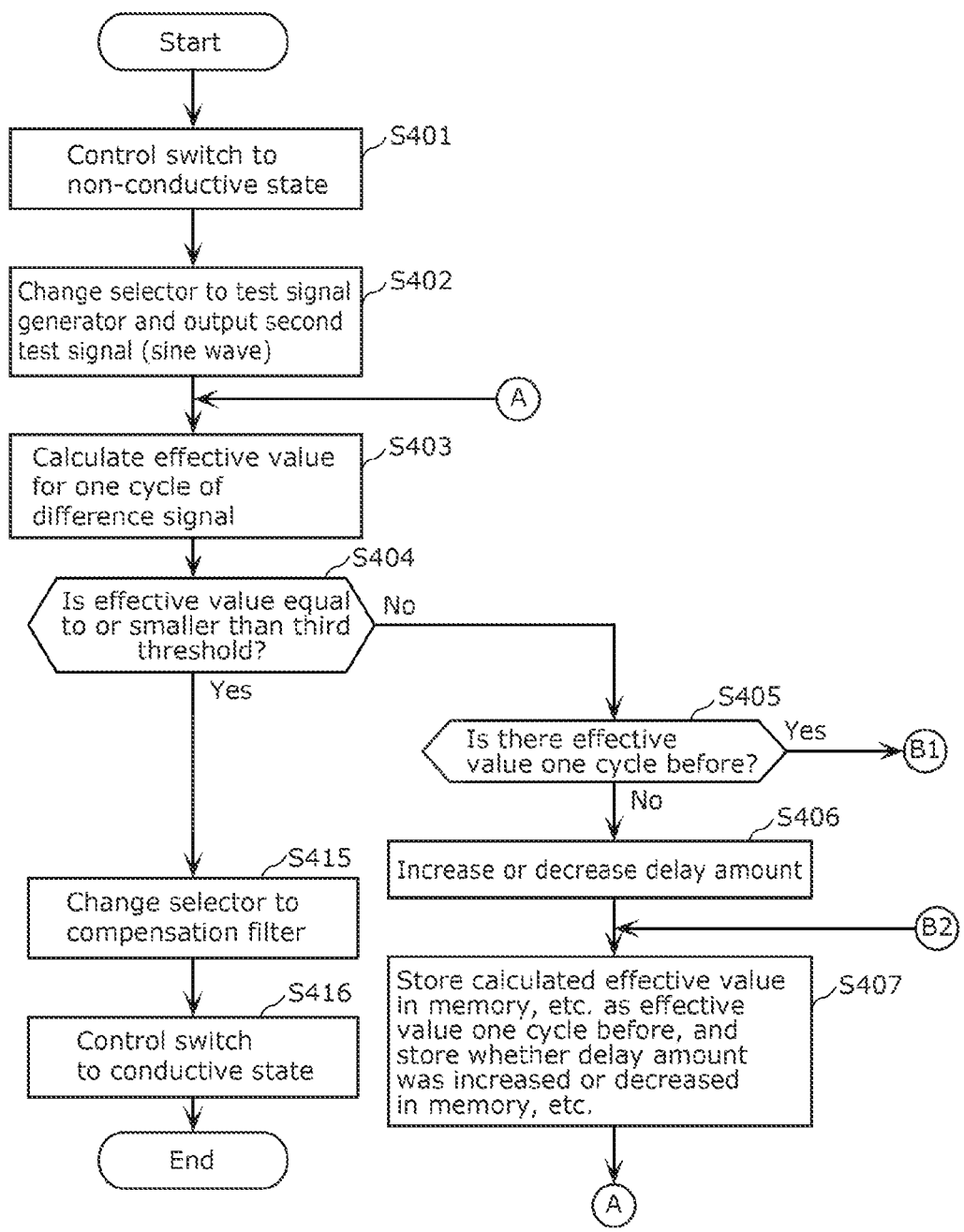
FIG. 8A is a flowchart showing an example of an operation at the time of determining the third parameter of the signal processing device according to the embodiment.
Figure 8B:
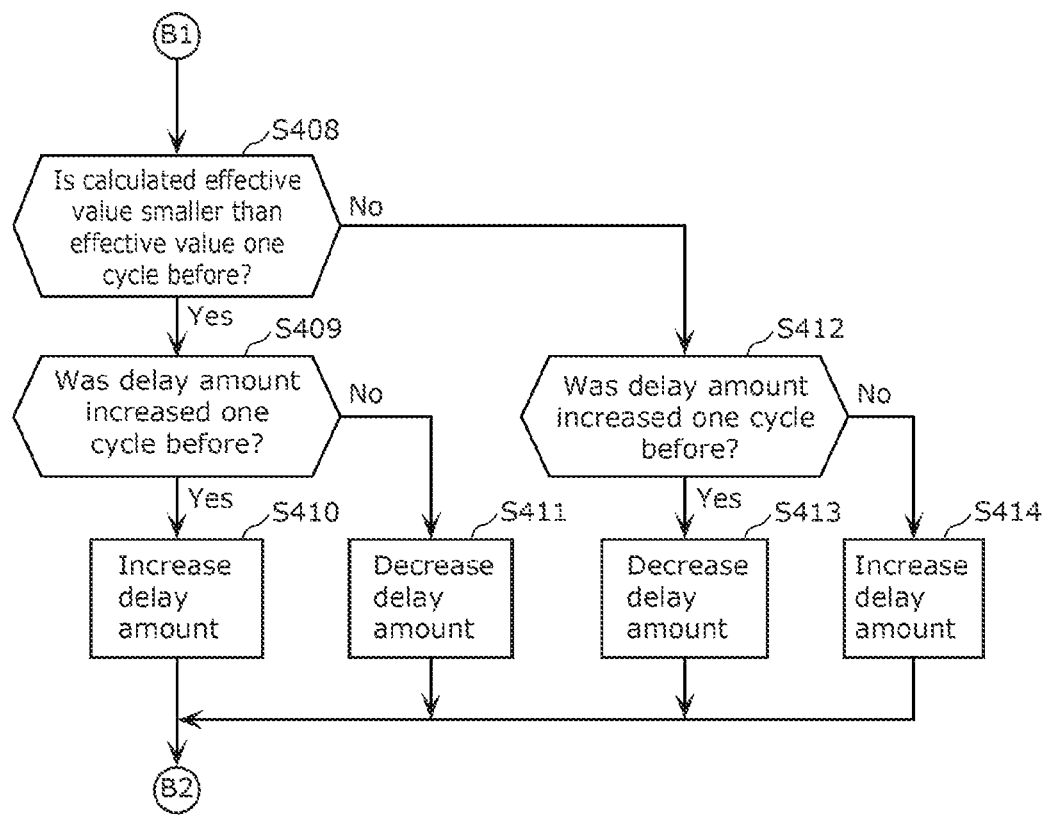
FIG. 8B is a flowchart showing an example of an operation at the time of determining the third parameter of the signal processing device according to the embodiment.

FIG. 8A and FIG. 8B are flowcharts showing an example of the operation at the time of determining the third parameter of signal processing device 1 according to the embodiment. FIG. 8A and FIG. 8B are flowcharts showing the details of step S103 of FIG. 2. The circled "A" in FIG. 8A indicates that the next process of step S407 is step S403. In addition, the circled "B1" and "B2" in FIG. 8A and FIG. 8B indicate that the next process in the case of Yes in step S405 is step S408, and indicate that the next process of step S410, step S411, step S413, and step S414 is step S407.

Controller 100 controls switch 80 so that it is in a non-conductive state (step S401). By making switch 80 in a non-conductive state, it is possible to prevent sound from being output from speaker 130 at the time of determining the third parameter. Since the second test signal is input to signal processing circuit 20 at the time of determining the third parameter, switch 80 is put into a non-conductive state so that the sound corresponding to the second test signal is not output from speaker 130.

Controller 100 changes the connection destination of selector 90 to test signal generator 120, and causes test signal generator 120 to output a second test signal (for example, a sine wave) having a predetermined frequency (step S402). For example, the frequency of the second test signal and the frequency of the first test signal are different, but they may be the same frequency, or the first test signal and the second test signal may be the same signal. In addition, it is assumed that the input signal is not input to subtractor 10 at the time of determining the third parameter. With this, as shown in FIG. 7, it becomes in such a state that the input signal and the feedback signal are not input to subtractor 10, and the second test signal is input to signal processing circuit 20. As shown in FIG. 7, controller 100 (third parameter determiner 103) determines the third parameter regarding the delay based on a difference signal which is a difference between the second digital signal having the delay adjusted by delay adjuster 53 and the third digital signal having the DC offset adjusted by offset adjuster 51 and the amplitude adjusted by amplitude adjuster 52, when the input signal and the feedback signal are not input to subtractor 10, and the second test signal is input to signal processing circuit 20.

Specifically, controller 100 calculates the effective value for one cycle of the difference signal (step S403). Since the second test signal input to signal processing circuit 20 is delayed (phase shifted) by A/D converter 40, it is also necessary to delay the signal input from signal processing circuit 20 to subtractor 71 via delay adjuster 53 or the like to the same extent in order for subtractor 71 to subtract signals at the same timing.

Controller 100 determines whether the calculated effective value is equal to or smaller than the third threshold (for example, C (positive value)) (step S404).

When the calculated effective value is not equal to or smaller than C (No in step S404), controller 100 determines whether there is an effective value of the difference signal one cycle before (step S405). Specifically, when the determination in step S405 is performed for the first time after the start of the process of determining the third parameter, there is an effective value one cycle before, and when the determination in step S405 has already been performed after the start of the process of determining the third parameter (specifically, when the process in step S407 described later has been performed), there is an effective value one cycle before.

When there is not an effective value of the difference signal one cycle before (No in step S405), controller 100 increases or decreases the delay amount in delay adjuster 53 (step S406). Since it is not known whether the output of delay adjuster 53 is delayed or advanced from the output of A/D converter 40 depending on the initial value of the delay amount in delay adjuster 53, first, the delay amount in delay adjuster 53 is either increased or decreased.

Next, controller 100 stores the calculated effective value as an effective value one cycle before in a memory or the like, and holds in the memory or the like whether the delay amount is increased or decreased (step S407). The information stored in the memory or the like is used in the processes after step S403 that are performed again.

Then, the process from step S403 is performed again.

When the effective value recalculated after the delay amount in delay adjuster 53 is adjusted (the effective value for the next one cycle after the one cycle at the time of the previous calculation) is not equal to or smaller than C (No in step S404), controller 100 determines whether the effective value one cycle before is stored in the memory or the like. Since the effective value one cycle before is stored in the memory or the like after the process in step S407, controller 100 determines that there is an effective value one cycle before (Yes in step S405).

Controller 100 determines whether the effective value calculated this time is smaller than the effective value one cycle before (step S408). If the phase difference between the output of delay adjuster 53 and the output of A/D converter 40 is smaller due to the adjustment of the delay amount performed after the calculation of the effective value one cycle before, it turns out that the previous adjustment of the delay amount is the correct adjustment.

When the effective value calculated this time is smaller than the effective value one cycle before (Yes in step S408), that is, when the adjustment of the delay amount one cycle before is the correct adjustment, controller 100 determines whether the delay amount was increased one cycle before (step S409).

When the delay amount was increased one cycle before (Yes in step S409), controller 100 further increases the delay amount (step S410) because the phase difference between the output of delay adjuster 53 and the output of A/D converter 40 is decreased by increasing the delay amount. When the delay amount was decreased one cycle before (No in step S409), controller 100 further decreases the delay amount (step S411) because the phase difference between the output of delay adjuster 53 and the output of A/D converter 40 is decreased by decreasing the delay amount.

When the effective value calculated this time is greater than the effective value one cycle before (No in step S408), that is, when the adjustment of the delay amount one cycle before is the erroneous adjustment, controller 100 determines whether the delay amount was increased one cycle before (step S412).

When the delay amount was increased one cycle before (Yes in step S412), controller 100 decreases the delay amount (step S413) because the phase difference between the output of delay adjuster 53 and the output of A/D converter 40 is increased by increasing the delay amount. When the delay amount was decreased one cycle before (No in step S412), controller 100 increases the delay amount (step S414) because the phase difference between the output of delay adjuster 53 and the output of A/D converter 40 is increased by decreasing the delay amount.

In this way, it is repeated until the effective value for one cycle of the difference signal becomes equal to or smaller than C that after adjusting the delay amount of delay adjuster 53, the difference signal (output of subtractor 71) when the second test signal is input to signal processing circuit 20 is confirmed, and the delay amount by delay adjuster 53 is adjusted again according to the difference signal.

When the calculated effective value is equal to or smaller than C (Yes in step S404), controller 100 determines the current delay amount in delay adjuster 53 as the third parameter.

Then, controller 100 changes the connection destination of selector 90 to compensation filter 72 (step S415), and controls switch 80 so that it is in a conductive state (step S416). With this, delay adjuster 53 adjusts the delay of the second digital signal using the third parameter regarding the delay determined based on the difference signal when the input signal and the feedback signal are not input to subtractor 10 and the second test signal is input to signal processing circuit 20.

It should be noted that an example of adjusting the third parameter by calculating the effective value for one cycle of the test signal has been described, but in order to simplify the calculation on the circuit, the third parameter may be adjusted using the maximum value of the amplitude for one cycle of the test signal.

It should be noted that controller 100 may continuously determine each parameter when determining each parameter in order of the first parameter, the second parameter, and the third parameter. In this case, after the determination of the first parameter, the connection destination of selector 90 may not be changed to compensation filter 72 as shown in step S208 of FIG. 4, and switch 80 may not be put into a conductive state as shown in step S209 of FIG. 4. In addition, after the determination of the second parameter, the connection destination of selector 90 may not be changed to compensation filter 72 as shown in step S310 of FIG. 6, and switch 80 may not be put into a conductive state as shown in step S311 of FIG. 6.

Effects, etc.

As described above, signal processing device 1 includes: subtractor 10 that subtracts a feedback signal from an input signal that is a digital audio signal and outputs a first digital signal; signal processing circuit 20 that performs signal processing on the first digital signal and outputs a second digital signal; power amplifier circuit 30 that amplifies the second digital signal, converts the second digital signal amplified into an analog signal, and outputs the analog signal; A/D converter 40 that converts the analog signal into a third digital signal and outputs the third digital signal; offset adjuster 51 that adjusts a DC offset for the third digital signal; amplitude adjuster 52 that adjusts an amplitude for the third digital signal; delay adjuster 53 that adjusts a delay of the second digital signal; and a calculator that extracts a difference signal which is a difference between the third digital signal having the DC offset adjusted by offset adjuster 51 and the amplitude adjusted by amplitude adjuster 52 and the second digital signal having the delay adjusted by delay adjuster 53, and outputs the feedback signal based on the difference signal. Offset adjuster 51 adjusts the DC offset using a first parameter regarding the DC offset determined based on an output of offset adjuster 51 which is output when no signal is input to signal processing circuit 20 by subtractor 10, amplitude adjuster 52 adjusts the amplitude using a second parameter regarding the amplitude determined based on (i) an output of amplitude adjuster 52 which is output when the input signal and the feedback signal are not input to subtractor 10 and a first test signal is input to signal processing circuit 20 and (ii) the first test signal, and delay adjuster 53 adjusts the delay using a third parameter regarding the delay determined based on the difference signal when the input signal and the feedback signal are not input to subtractor 10 and a second test signal is input to signal processing circuit 20.

According to this, when no signal is input to signal processing circuit 20 by subtractor 10, the output of A/D converter 40 becomes the DC offset error itself in A/D converter 40. For this reason, the DC offset can be adjusted using the first parameter by determining the first parameter (for example, the offset amount in offset adjuster 51) so that the output of offset adjuster 51 at this time becomes small (for example, so that it becomes equal to or smaller than a predetermined first threshold).

In addition, when the input signal and the feedback signal are not input to subtractor 10 and the first test signal is input to signal processing circuit 20, the output of A/D converter 40 is a signal obtained by amplifying the first test signal by power amplifier circuit 30. For this reason, the amplitude can be adjusted using the second parameter by determining the second parameter (for example, the gain of amplitude adjuster 52) so that the difference between the amplitude of the output of amplitude adjuster 52 and the amplitude of the first test signal at this time becomes small (for example, so that it becomes equal to or smaller than a predetermined second threshold).

In addition, when the input signal and the feedback signal are not input to subtractor 10 and the second test signal is input to signal processing circuit 20, the difference signal is the difference between the output of delay adjuster 53 based on the second test signal and the output of A/D converter 40. For this reason, the delay can be adjusted using the third parameter by determining the third parameter (for example, the delay amount in delay adjuster 53) so that the difference signal at this time becomes small (for example, so that it becomes equal to or smaller than a predetermined third threshold).

Not inputting a signal or inputting a test signal can be performed, for example, automatically, and when determining the first parameter, the second parameter, and the third parameter as in the present disclosure, it is not necessary to perform manual adjustment using a variable resistor. For this reason, the resistance value does not shift due to aged deterioration of the variable resistance, the resistance value also does not shift due to impact such as vibration, and the adjustment of the variable resistance does not vary depending on the adjusting person, so that the amplitude, direct current offset, and delay of the signal that is to be fed back can be adjusted accurately. Therefore, the distortion component can be extracted more accurately than before by using the feedback technology. Since the distortion component can be extracted more accurately, the distortion component generated in power amplifier circuit 30 or the like can be canceled with higher accuracy.

In addition, amplitude adjuster 52 may adjust the amplitude of the third digital signal having the DC offset adjusted by offset adjuster 51.

Since the magnitude of the amplitude also changes according to the DC offset, if the amplitude is adjusted before the DC offset is adjusted, the amplitude may not be adjusted accurately. Therefore, by adjusting the amplitude of the third digital signal having the DC offset adjusted, the distortion component can be extracted more accurately.

In addition, signal processing device 1 may further include controller 100 for determining a first parameter, a second parameter, and a third parameter, and controller 100 may determine each parameter in order of the first parameter, the second parameter, and the third parameter.

The magnitude of the amplitude also changes according to the DC offset, and the magnitude of the difference signal when adjusting the delay changes according to the amplitude and the DC offset. For this reason, each parameter can be accurately determined by first determining the first parameter regarding the DC offset, then the second parameter regarding the amplitude, and then the third parameter regarding the delay.

In addition, signal processing device 1 may further include switch 80 provided between power amplifier circuit 30 and speaker 130 that converts an analog signal output from power amplifier circuit 30 to sound. For example, signal processing device 1 may further include controller 100 that controls switch 80, and controller 100 may put switch 80 into a non-conductive state when the first test signal or the second test signal is input to signal processing circuit 20.

For example, in the case that switch 80 is not provided and power amplifier circuit 30 and speaker 130 are directly connected, when the first test signal or the second test signal is input to signal processing circuit 20, a sound corresponding to the first test signal or the second test signal may be unintentionally output from speaker 130 to surprise the user or cause discomfort to the user. Then, by providing switch 80 between power amplifier circuit 30 and speaker 130 and putting switch 80 into a non-conductive state when the first test signal or the second test signal is input to signal processing circuit 20, it is possible to prevent the sound corresponding to the first test signal or the second test signal from being output.

Other Embodiments

As described above, an embodiment has been described as an example of the technology disclosed in the present application. However, the technology in the present disclosure is not limited thereto, and can also be applied to embodiments in which changes, replacements, additions, omissions or the like are made as appropriate. In addition, it is also possible to combine each component described in the above embodiment to make a new embodiment.

For example, in the above embodiment, controller 100 is provided in signal processing device 1, but it may not be a component of signal processing device 1. For example, controller 100 may be provided in a device that controls signal processing device 1 provided separately from signal processing device 1.

In addition, for example, in the above embodiment, amplitude adjuster 52 adjusts the amplitude of the third digital signal having the DC offset adjusted by offset adjuster 51, but the present invention is not limited thereto. For example, offset adjuster 51 may adjust the DC offset for the third digital signal having the amplitude adjusted by amplitude adjuster 52. That is, the output of A/D converter 40 may be input to amplitude adjuster 52, and the output of offset adjuster 51 may be input to subtractor 71 (calculator).

In addition, for example, in the above embodiment, each parameter is determined in order of the first parameter, the second parameter, and the third parameter, but it is not necessary to determine in this order.

In addition, for example, in the above embodiment, signal processing device 1 includes switch 80, but it may not include switch 80.

In addition, for example, in the above embodiment, a calculator that extracts a difference signal which is a difference between the third digital signal having the DC offset adjusted by offset adjuster 51 and the amplitude adjusted by amplitude adjuster 52 and the second digital signal having the delay adjusted by delay adjuster53, and outputs the feedback signal based on the difference signal includes subtractor 71, compensation filter 72, and decimation filter 73, but is not limited thereto. For example, the calculator may include at least subtractor 71.

In addition, the present disclosure can be realized not only as signal processing device 1, but also as an adjusting method including steps (processes) performed by the components included in controller 100.

Specifically, the adjusting method is a method for adjusting parameters for a signal processing device which includes: a subtractor that subtracts a feedback signal from an input signal that is a digital audio signal and outputs a first digital signal; a signal processing circuit that performs signal processing on the first digital signal and outputs a second digital signal; a power amplifier circuit that amplifies the second digital signal, converts the second digital signal amplified into an analog signal, and outputs the analog signal; an A/D converter that converts the analog signal into a third digital signal; an offset adjuster that adjusts a DC offset for the third digital signal; an amplitude adjuster that adjusts an amplitude for the third digital signal; a delay adjuster that adjusts a delay of the second digital signal; and a calculator that extracts a difference signal which is a difference between the third digital signal having the DC offset adjusted by the offset adjuster and the amplitude adjusted by the amplitude adjuster and the second digital signal having the delay adjusted by the delay adjuster, and outputs the feedback signal based on the difference signal. The adjusting method includes: determining a first parameter regarding the DC offset determined based on an output of the offset adjuster which is output when no signal is input to the signal processing circuit by the subtractor; determining a second parameter regarding the amplitude based on (i) an output of the amplitude adjuster which is output when the input signal and the feedback signal are not input to the subtractor and a first test signal is input to the signal processing circuit and (ii) the first test signal; and determining a third parameter regarding the delay based on the difference signal when the input signal and the feedback signal are not input to the subtractor and a second test signal is input to the signal processing circuit.

For example, those steps may be performed by a computer (computer system). Then, the present disclosure can be realized as a program for causing a computer to execute the steps included in those methods. Furthermore, the present disclosure can be realized as a non-temporary computer-readable recording medium such as a CD-ROM on which the program is recorded.

For example, when the present disclosure is realized by a program (software), each step is executed by executing the program using hardware resources such as a CPU, a memory, and an input/output circuit of a computer. That is, each step is executed by the CPU obtaining data from the memory, the input/output circuit or the like and performs an operation, or outputs the operation result to the memory, the input/output circuit or the like.

In addition, the component included in signal processing device 1 of the above-described embodiment may be realized as a large scale integration (LSI) which is an integrated circuit (IC).

In addition, the integrated circuit is not limited to the LSI, and may be realized by a dedicated circuit or a general-purpose processor. A programmable field programmable gate array (FPGA) or a reconfigurable processor in which the connections and settings of circuit cells inside the LSI can be reconfigured may be used.

Furthermore, if an integrated circuit technology that replaces an LSI appears due to advances in semiconductor technology or another technology derived therefrom, it is natural that the circuit integration of the components included in signal processing device 1 may be performed using that technology.

As described above, an embodiment has been described as an example of the technology in the present disclosure. To that end, the accompanying drawings and detailed description have been provided.

Therefore, the components described in the attached drawings and the detailed description may include not only the components essential for problem solving but also the components not essential for problem solving. For that reason, the fact that these non-essential components are described in the accompanying drawings or detailed description should not immediately determine that those non-essential components are essential.

In addition, since the above-described embodiment is for exemplifying the technology in the present disclosure, various changes, replacements, additions, omissions or the like can be made within the scope of claims or the equivalent scope thereof.

INDUSTRIAL APPLICABILITY

The present disclosure is applicable to devices that reproduce sound of audio equipment, televisions, personal computers (PCs), mobile equipment or the like.

The invention claimed is:

1. A signal processing device, comprising:
a subtractor that subtracts a feedback signal from an input signal that is a digital audio signal and outputs a first digital signal;
a signal processing circuit that performs signal processing on the first digital signal and outputs a second digital signal;
a power amplifier circuit that amplifies the second digital signal, converts the second digital signal amplified into an analog signal, and outputs the analog signal;
an A/D converter that converts the analog signal into a third digital signal and outputs the third digital signal;
an offset adjuster that adjusts a DC offset for the third digital signal;
an amplitude adjuster that adjusts an amplitude for the third digital signal;

a delay adjuster that adjusts a delay of the second digital signal; and a calculator that extracts a difference signal which is a difference between the third digital signal having the DC offset adjusted by the offset adjuster and the amplitude adjusted by the amplitude adjuster and the second digital signal having the delay adjusted by the delay adjuster, and outputs the feedback signal based on the difference signal, wherein the offset adjuster adjusts the DC offset using a first parameter regarding the DC offset determined based on an output of the offset adjuster which is output when no signal is input to the signal processing circuit by the subtractor, the amplitude adjuster adjusts the amplitude using a second parameter regarding the amplitude determined based on (i) an output of the amplitude adjuster which is output when the input signal and the feedback signal are not input to the subtractor and a first test signal is input to the signal processing circuit and (ii) the first test signal, and the delay adjuster adjusts the delay using a third parameter regarding the delay determined based on the difference signal when the input signal and the feedback signal are not input to the subtractor and a second test signal is input to the signal processing circuit.

2. The signal processing device according to claim 1, wherein the amplitude adjuster adjusts the amplitude for the third digital signal having the DC offset adjusted by the offset adjuster.

3. The signal processing device according to claim 1, further comprising:
a controller that determines the first parameter, the second parameter, and the third parameter, and
wherein the controller determines the first parameter, the second parameter, and the third parameter in stated order.

4. The signal processing device according to claim 1, further comprising:
a switch that is provided between the power amplifier circuit and a speaker that converts the analog signal output from the power amplifier circuit to sound.

5. The signal processing device according to claim 4, further comprising:
a controller that controls the switch,
wherein the controller puts the switch into a non-conductive state when the first test signal or the second test signal is input to the signal processing circuit.

6. A method for adjusting parameters for a signal processing device which includes:
a subtractor that subtracts a feedback signal from an input signal that is a digital audio signal and outputs a first digital signal;
a signal processing circuit that performs signal processing on the first digital signal and outputs a second digital signal;
a power amplifier circuit that amplifies the second digital signal, converts the second digital signal amplified into an analog signal, and outputs the analog signal;
an A/D converter that converts the analog signal into a third digital signal and outputs the third digital signal;
an offset adjuster that adjusts a DC offset for the third digital signal;
an amplitude adjuster that adjusts an amplitude for the third digital signal;
a delay adjuster that adjusts a delay of the second digital signal; and
a calculator that extracts a difference signal which is a difference between the third digital signal having the DC offset adjusted by the offset adjuster and the amplitude adjusted by the amplitude adjuster and the second digital signal having the delay adjusted by the delay adjuster, and outputs the feedback signal based on the difference signal, the method comprising:
determining a first parameter regarding the DC offset determined based on an output of the offset adjuster which is output when no signal is input to the signal processing circuit by the subtractor;
determining a second parameter regarding the amplitude based on (i) an output of the amplitude adjuster which is output when the input signal and the feedback signal are not input to the subtractor and a first test signal is input to the signal processing circuit and (ii) the first test signal; and
determining a third parameter regarding the delay based on the difference signal when the input signal and the feedback signal are not input to the subtractor and a second test signal is input to the signal processing circuit.

* * * * *